United States Patent
Hashimoto

(10) Patent No.: US 10,019,356 B2
(45) Date of Patent: Jul. 10, 2018

(54) RECONSTRUCT DRIVE FOR DYNAMIC RESIZING

(71) Applicant: TOSHIBA MEMORY CORPORATION, Tokyo (JP)

(72) Inventor: Daisuke Hashimoto, Susono Shizuoka (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/877,330

(22) Filed: Jan. 22, 2018

(65) Prior Publication Data
US 2018/0143901 A1 May 24, 2018

Related U.S. Application Data

(60) Division of application No. 15/699,972, filed on Sep. 8, 2017, which is a continuation of application No. 14/526,424, filed on Oct. 28, 2014, now Pat. No. 9,760,482.

(51) Int. Cl.
| | |
|---|---|
| *G06F 12/00* | (2006.01) |
| *G06F 12/02* | (2006.01) |
| *G11C 29/00* | (2006.01) |

(52) U.S. Cl.
CPC .......... *G06F 12/0246* (2013.01); *G11C 29/76* (2013.01); *G11C 29/883* (2013.01); *G06F 2212/1016* (2013.01); *G06F 2212/7204* (2013.01); *G06F 2212/7205* (2013.01)

(58) Field of Classification Search
CPC ......... G06F 12/0246; G06F 2212/1016; G06F 2212/7204; G06F 2212/7205
See application file for complete search history.

(56) References Cited

U.S. PATENT DOCUMENTS

| | | |
|---|---|---|
| 2004/0196707 A1 | 10/2004 | Yoon et al. |
| 2011/0041039 A1 | 2/2011 | Harari et al. |
| 2012/0278532 A1 | 11/2012 | Bolanowski |
| 2014/0223134 A1 | 8/2014 | Chen et al. |
| 2016/0092121 A1 | 3/2016 | Nazari et al. |

*Primary Examiner* — Gurtej Bansal
(74) *Attorney, Agent, or Firm* — Patterson & Sheridan, LLP

(57) ABSTRACT

A solid-state drive (SSD) is configured for dynamic resizing. When the SSD approaches the end of its useful life because the over-provisioning amount is nearing the minimum threshold as a result of an increasing number of bad blocks, the SSD is reformatted with a reduced logical capacity so that the over-provisioning amount may be maintained above the minimum threshold.

14 Claims, 6 Drawing Sheets

CDB of Reconstruct API

| Bit<br>Byte | 7 | 6 | 5 | 4 | 3 | 2 | 1 | 0 |
|---|---|---|---|---|---|---|---|---|
| 0 | \multicolumn{8}{c} OPERATION CODE (xxh) |
| 1 | 1st input parameter (mode) |
| 2 | (2nd input parameter (override OP)) |

Returned Data for Get_Overprovisioning_Information

| Bit<br>Byte | 7 | 6 | 5 | 4 | 3 | 2 | 1 | 0 |
|---|---|---|---|---|---|---|---|---|
| 0 | Over Provisioning Rate (%) | | | | | | | |
| 1 | Minumum OP Rate (%) | | | | | | | |

RECONSTRUCT DRIVE FOR DYNAMIC RESIZING

CROSS-REFERENCE TO RELATED APPLICATION

This application is a divisional of U.S. patent application Ser. No. 15/699,972, filed on Sep. 8, 2017, which is a continuation of U.S. patent application Ser. No. 14/526,424, filed on Oct. 28, 2014, now U.S. Pat. No. 9,760,482, issued Sep. 12, 2017, the entire contents of which are incorporated herein by reference.

BACKGROUND

Recently, solid state drives (SSDs) have been adopted widely as it provides lower latency input-output operations (IOs) than rotating disk based drives. However, the acquisition costs of SSDs are comparatively higher, and the performance of SSDs degrades as the number of bad blocks in the SSDs increases over time. As a buffer against bad blocks that increase over time and to also provide a storage area that can be used for garbage collection and other system functions, SSDs are typically over-provisioned by a set amount. To give an example, an SSD that has a logical capacity of 100 GB, i.e., the capacity that is exposed as being usable capacity, may be initially over-provisioned by a predetermined amount, e.g., 20 GB. This predetermined amount is set to be larger than a minimum amount that is needed for functions such as garbage collection so that the SSD will not fail as long as the number of bad blocks remain below a certain limit. It should be recognized that the larger this predetermined over-provisioning amount becomes, the longer the useful life of the SSD will be. In addition, a larger over-provisioning amount improves the IOPS (IOs per second) performance of the SSD. However, the over-provisioning amount should not be set too large because it takes away from the useful capacity of the SSD.

SUMMARY

Embodiments provide an SSD that is configured for dynamic resizing. According to embodiments, when the SSD approaches the end of its useful life because the over-provisioning amount is nearing the minimum threshold as a result of an increasing number of bad blocks, the SSD is reformatted with a reduced logical capacity so that the over-provisioning amount may be maintained above the minimum threshold.

DETAILED DESCRIPTION

Figure 1:
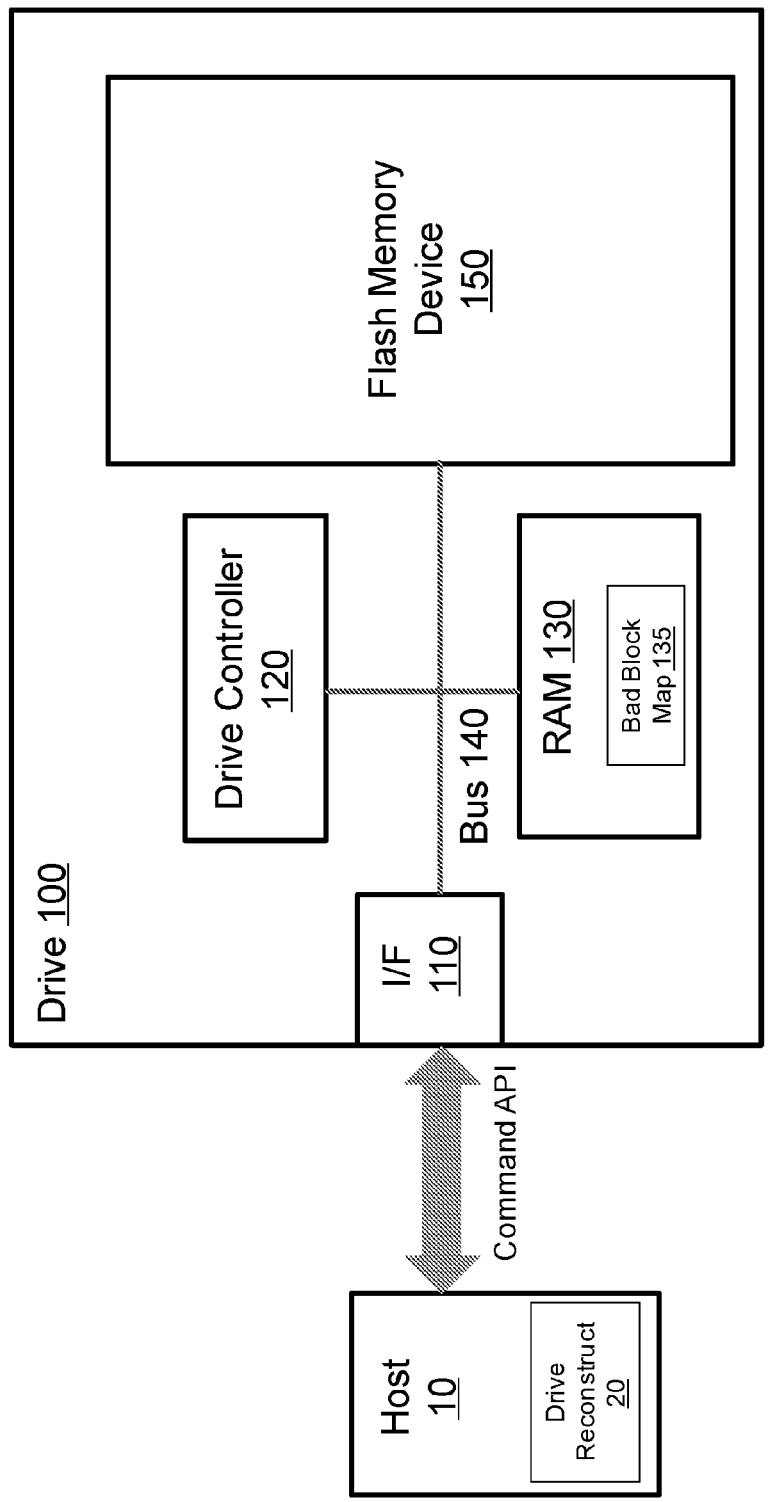
FIG. 1 is a drive connected to a host in which embodiments may be practiced.

FIG. 1 is a drive (e.g., an SSD) 100 connected to a host 10 in which embodiments may be practiced. Host 10 is a computing device that issues IOs to drive 100 through standard storage interfaces such as iSCSI, SATA, PCIe, SAS, etc. and includes conventional components of a computer such as one or more processors, random access memory, a network interface, and a disk interface. In the embodiments illustrated herein, host 10 is further configured with a drive reconstruct software module 20 that resides in memory and executes on the processors to reconfigure drive 100 according to the method described below in conjunction with FIG. 7.

Drive 100 includes an interface 110, e.g., an iSCSI interface, a SATA interface, a PCIe interface, or a SAS interface, a drive controller 120, a random access memory (RAM) 130, a high-speed data path 140, which may be any high-speed bus known in the art, such as a double data rate (DDR) bus, a DDR2 bus, a DDR3 bus, or the like, and a flash memory device 150. Drive controller 120 is configured to control the operation of drive 100, and is connected to RAM 130 and flash memory device 150 via high-speed data path 140. Drive controller 120 is also configured to control interface 110. Some or all of the functionality of drive controller 120 may be implemented as firmware, application-specific integrated circuits, and/or a software application. RAM 130 is a volatile semiconductor memory device, such as a dynamic RAM (DRAM). RAM 130 is configured for use as a data buffer for SSD 140, temporarily storing data received from host 10.

In addition, drive controller 120 maintains a bad block map 135 in RAM 130. Bad block map 135 includes addresses of blocks in flash memory device 150 that have been determined by driver controller 120 to be bad. Drive controller 120 may make this determination during reads and writes performed on blocks of flash memory device 150, or during a partial or full scan for bad blocks performed on blocks of flash memory device 150.

Flash memory device 150 is a non-volatile semiconductor storage, such as a NAND flash chip, that can be electrically erased and reprogrammed. For clarity, drive 100 is illustrated in FIG. 1 to include a single flash memory device 150, but in many embodiments, drive 100 includes multiple flash memory devices 150. Flash memory device 150 includes a plurality of memory cells that are grouped into readable and writable pages, each page having a size of 4 KB to 16 KB. These pages are organized into memory blocks (typically 128 to 512 pages per block), the memory block representing the smallest erasable unit of flash memory device 150.

Figure 2:
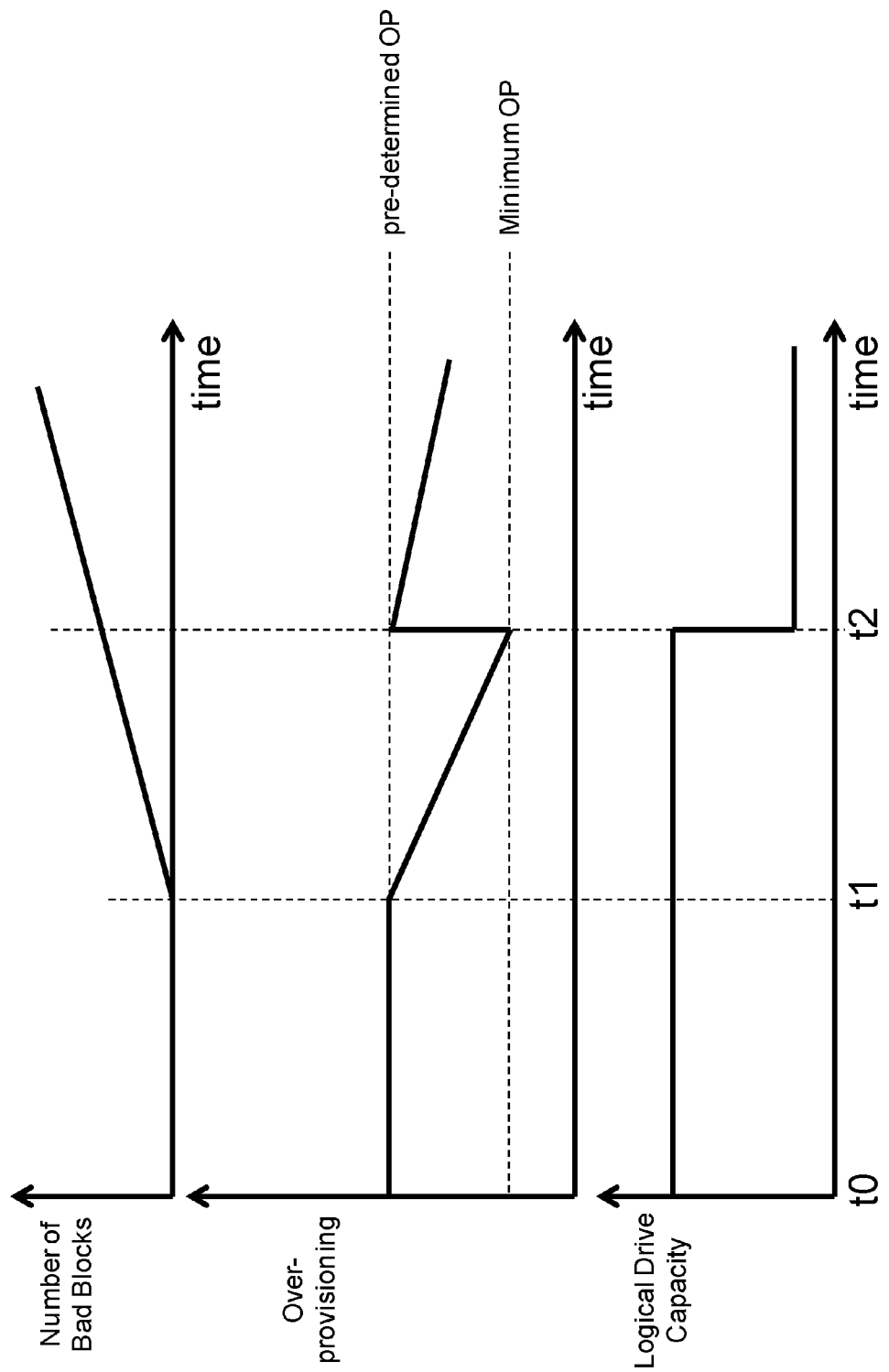
FIG. 2 illustrates changes to a drive's over-provisioning percentage and logical capacity over time when embodiments are implemented.

Flash memory device 150 has an associated raw physical capacity. During a drive initialization process known as formatting, drive controller 120 configures flash memory device 150 with a logical capacity that is equal to the raw physical capacity minus a system area amount (typically a fixed amount) and a predetermined over-provisioning amount, which as described above is used as a buffer against bad blocks that increase over time and to also provide a storage area that can be used for garbage collection and other system functions. FIG. 2 shows the relationship between the over-provisioned amount and the logical capacity of drive 100. At time t0, when there are no bad blocks, the over-provisioned amount is at its predetermined level. However, as the number of bad blocks begins to increase at time t1, the over-provisioned amount begins to decrease. At time t2, the over-provisioned amount reaches a minimum threshold, and drive 100 is dynamically resized according to techniques described below. As a result of the dynamic resizing, the logical capacity decreases and the over-provisioned amount increases to the predetermined level.

Figures 3, 4:
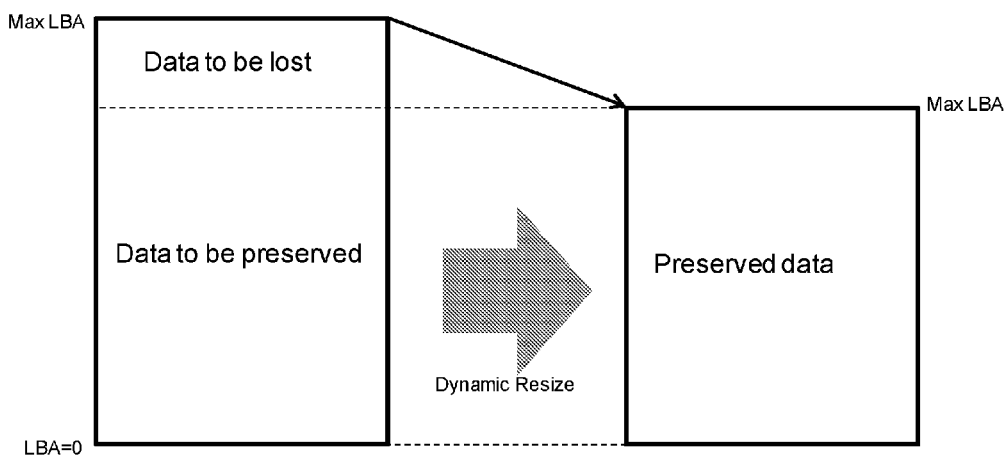
FIG. 3 illustrates one example of a CDB for a first API employed in the method according to embodiments.
FIG. 4 graphically illustrates how much of the user data can be preserved while performing dynamic resizing according to embodiments.

To support dynamic resizing, drive 100 is configured with two application programming interfaces (APIs) that are exposed to host 10. The first is the Reconstruct API, which has a single input parameter or two input parameters. One example of the Reconstruct API has a command descriptor block (CDB) shown in FIG. 3. If the first input parameter is 0, drive controller 120 executes the dynamic resizing without scanning flash memory device 150 for bad blocks. If the first input parameter is 1, drive controller 120 executes the dynamic resizing after a partial scan of flash memory device 150 for bad blocks. If the first input parameter is 2, drive controller 120 executes the dynamic resizing after a full scan of flash memory device 150 for bad blocks. Optionally, the predetermined over-provisioning amount may be overridden by the second input parameter when the second input parameter has a non-zero value. Upon receiving the Reconstruct API from host 10, driver controller 120 returns an acknowledgement of receipt to host 10 and executes the process for dynamic resizing as described below in conjunction with FIG. 7. Other features of the Reconstruct API are as follows. User data is lost when this API is executed. Alternatively, the user data up to the amount of the resized logical capacity may be preserved as shown in FIG. 4. In addition, after the acknowledgement of this API, host 10 may not be able to detect drive 100 and commands from host 10 are not guaranteed to be executed.

Figures 5, 6:
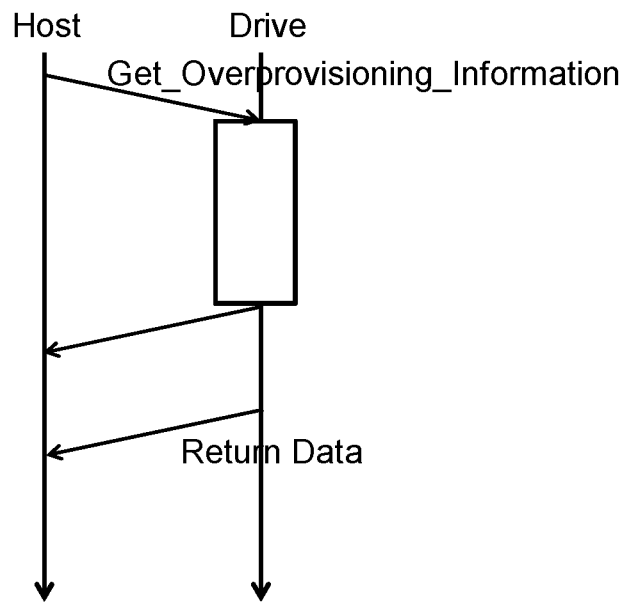
FIG. 5 illustrates a communication flow between the host and the drive upon issuance of a second API employed in the method according to embodiments.
FIG. 6 illustrates an example data format for over-provisioning information that is returned from the drive to the host.

The second API is the Get_Overprovisioning_Information API. This API has no input parameters. The communication flow between host 10 and drive controller 120 upon issuance of this API by host 10 is schematically illustrated in FIG. 5. Upon receiving the Get_Overprovisioning_Information API from host 10, driver controller 120 reads the predetermined over-provisioning amount and the minimum over-provisioning amount for normal operation from drive metadata stored in RAM 130 and/or flash memory device 150, and also computes the current over-provisioning amount according to the formula: current over-provisioning amount=raw physical capacity−current logical capacity−bad block capacity−system area amount. Then, driver controller 120 returns status (PASS or FAIL) to host 10 as an acknowledgement and thereafter returns the predetermined over-provisioning amount and the minimum over-provisioning amount to host 10 as over-provisioning information. One example data format for the predetermined over-provisioning amount and the minimum over-provisioning amount is illustrated in FIG. 6.

Figure 7:
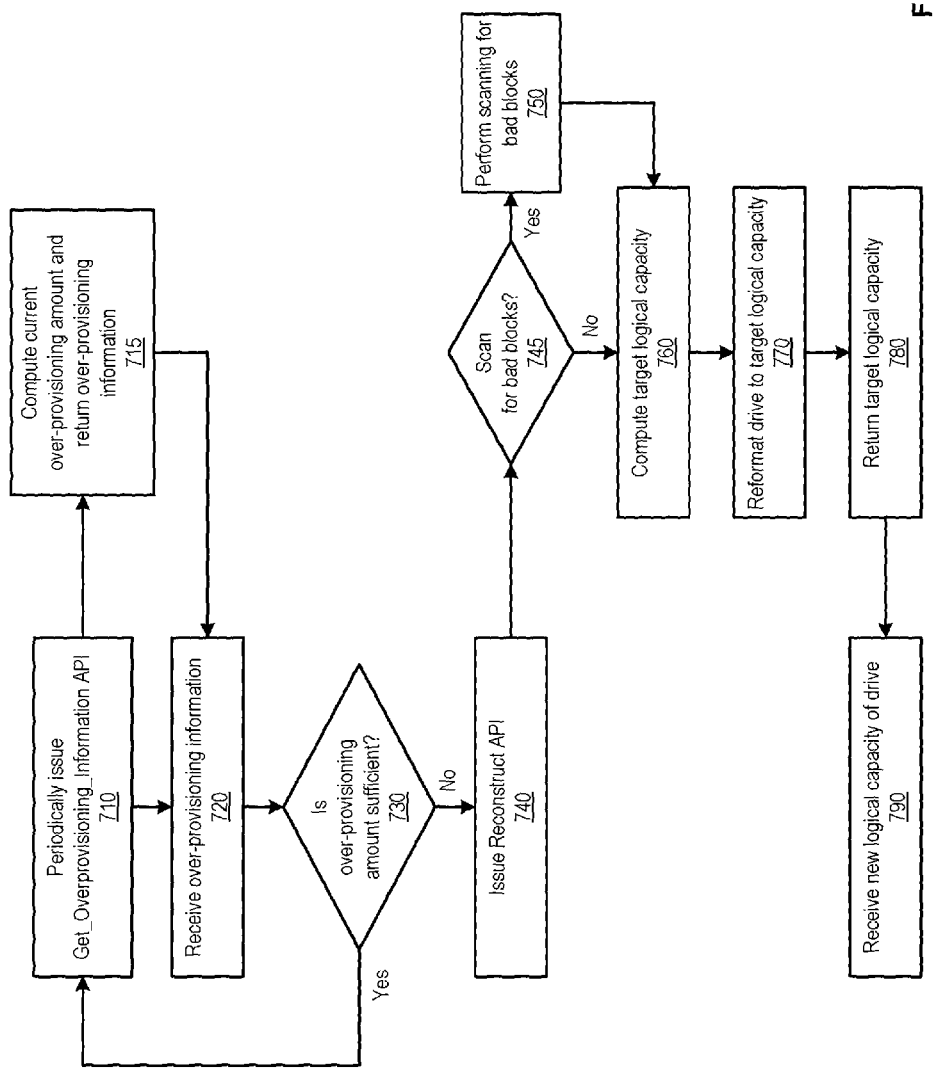
FIG. 7 is a flow diagram of steps carried out by the host and the drive during dynamic resizing according to embodiments.

FIG. 7 is a flow diagram of steps carried out by host 10 and drive 100 during dynamic resizing according to embodiments. Steps 710, 720, 730, 740, and 790 are carried out by host 10 through drive reconstruct software module 20. Steps 715, 745, 750, 760, 770, and 780 are carried out by drive 100, in particular drive controller 120. Although the steps of FIG. 7 are described herein as performed by host 10 and drive 100, it should be recognized that other systems, such as integrated host-drive systems, may implement the steps of FIG. 7.

The method of FIG. 7 begins at step 710 where host 10 issues the Get_Overprovisioning_Information API to drive 100. This step may be executed once every hour, after a predetermined size of data has been written, after a predetermined percentage of the logical capacity is written, when drive 100 becomes idle, or when drive 100 is powered up. As a result, host 10 can recognize that drive 100 is approaching end-of-life in advance and can dynamically resize the logical capacity of drive 100 before drive 100 fails. Upon receipt of Get_Overprovisioning_Information API from host 10, drive controller 120 at step 715 reads the predetermined over-provisioning amount and the minimum over-provisioning amount for normal operation from drive metadata stored in RAM 170 and/or flash memory device 150, and also computes the current over-provisioning amount according to the formula: current over-provisioning amount=raw physical capacity−current logical capacity−bad block capacity. The bad block capacity is determined based on the information stored in bad block map 135. For example, if bad block map 135 indicates 100 blocks as being bad blocks and each block is 512 KB in size, the bad block capacity will be 5.12 MB.

Figure 8:
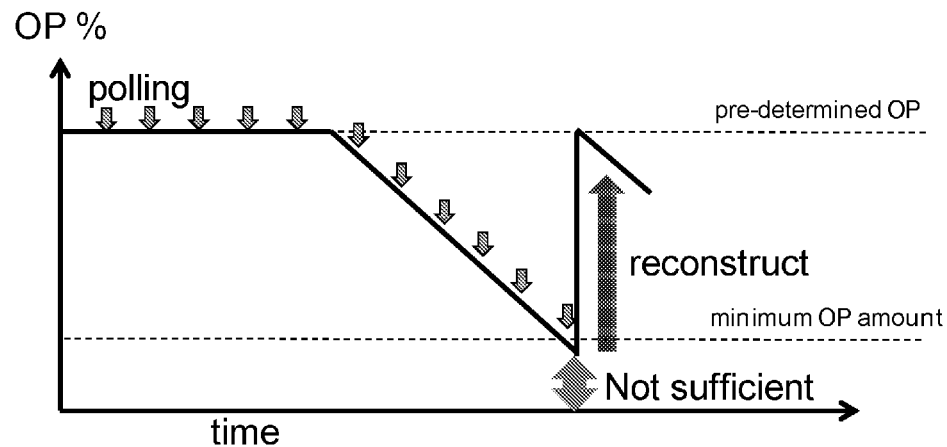
FIG. 8 illustrates graphically a situation where a current over-provisioning amount is not sufficient.

At step 720, host 10 receives the over-provisioning information including the predetermined over-provisioning amount, the minimum over-provisioning amount, and the current over-provisioning amount from drive 100. Based on this, at step 730, host 10 determines if the current over-provisioning amount is sufficient, e.g., greater than the minimum over-provisioning amount. FIG. 8 illustrates graphically a situation where the current over-provisioning amount is not sufficient. When host 10 determines that the current over-provisioning amount is sufficient, the execution flow returns to step 710 where host 10 issues the Get_Overprovisioning_Information API to drive 100 at the start of the next period. On the other hand, when host 10 determines that the current over-provisioning amount is not sufficient, host 10 at step 740 issues the Reconstruct API to drive 100. As explained above, the Reconstruct API may be issued with an input parameter of 0, 1, or 2.

Upon receipt of the Reconstruct API, at step 745, drive controller 120 returns an acknowledgement of receipt to host 10 (not shown) and determines if scanning of flash memory device 150 for bad blocks is needed according to the value of the input parameter included in the Reconstruct API. If the input parameter is 0, drive controller 120 proceeds to step 760 without scanning. If the input parameter is 1 or 2, drive controller 120 scans flash memory device 150 for bad blocks and updates bad block map 135 accordingly. If the input parameter is 1, drive controller 120 performs partial scanning for bad blocks and, if the input parameter is 2, drive controller 120 performs full scanning for bad blocks. During the partial or full scan for bad blocks, drive controller 120 updates bad block map 135 to include bad blocks that are discovered as a result of the scanning. The partial or full scan include a self-test comprising block erase tests, page program tests and/or page read tests. When an erase failure, a program failure, or an uncorrectable ECC failure occurs during the partial or full scan, a block in which the failure happens is determined as a bad block.

At step 760, driver controller 120 computes a target logical capacity for flash memory device 150. The target logical capacity is computed according to the formula: target logical capacity=raw physical capacity−predetermined over-provisioning amount−bad block capacity−system area amount. The bad block capacity is determined based on the information stored in bad block map 135 as described above in conjunction with step 715.

Figure 9:
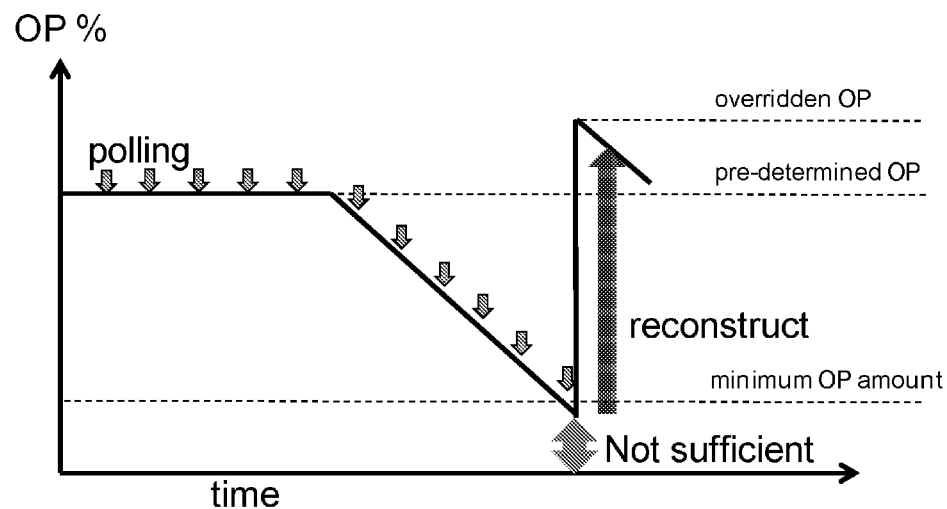
FIG. 9 illustrates graphically an example where an over-provisioning amount is specified in the first API.

If the predetermined over-provisioning amount is overridden by the second input parameter of the Reconstruct API, the target logical capacity is computed according to the formula: target logical capacity=raw physical capacity−overridden over-provisioning amount−bad block capacity−system area amount. FIG. 9 illustrates graphically an example where the second input parameter of the Reconstruct API was given a value greater than the predetermined over-provisioning amount.

After the target logical capacity is computed at step 760, driver controller 120 at step 770 carries out the reformatting of flash memory device 150 according to known techniques so that the resulting logical capacity after the reformatting is equal to the target logical capacity. It should be recognized that during this reformatting, user data stored in flash memory device 150 will be lost. In addition, host 10 will not be able to detect drive 100 and commands from host 10 will not be acknowledged.

Upon completion of the reformatting and as acknowledgement of successful completion, driver controller 120 at step 380 returns the target logical capacity to host 10. Upon receipt of the target logical capacity at step 390, host 10 recognizes that normal IO operation of drive 100 is resumed and resumes periodic polling for over-provisioning information at step 310.

While the foregoing is directed to embodiments of the present invention, other and further embodiments of the invention may be devised without departing from the basic scope thereof, and the scope thereof is determined by the claims that follow.

What is claimed is:

1. A storage device comprising:
a non-volatile semiconductor memory having a raw physical capacity equal to a first size; and
a controller configured to over-provision the non-volatile semiconductor memory by a predetermined amount, to track bad blocks in the non-volatile semiconductor memory, and to format the non-volatile semiconductor memory to reduce a logical capacity thereof to a second size in response to a command from a host,
wherein the second size is equal to the first size minus: (i) a third size corresponding to the predetermined amount and (ii) a total size of the bad blocks.

2. The storage device of claim 1, wherein the predetermined amount is specified in the command from the host.

3. The storage device of claim 1, wherein the controller is configured to respond to a query from the host for a value representing extra usable capacity with a value that is equal to the first size minus: (i) a size corresponding to a current logical capacity of the non-volatile semiconductor memory and (ii) the total size of the bad blocks.

4. The storage device of claim 1, wherein the command from the host includes a parameter that can be set to one of multiple values, the value of the parameter determining whether or not the controller is to carry out a scan for bad blocks prior to reducing the logical capacity thereof.

5. The storage device of claim 4, wherein the controller does not carry out a scan for bad blocks if the parameter is set to a first value, carries out a partial scan for bad blocks if the parameter is set to a second value, and carries out a complete scan for bad blocks if the parameter is set to a third value.

6. The storage device of claim 5, further comprising a volatile memory in which a map that tracks the bad blocks is maintained.

7. The storage device of claim 6, wherein the controller updates the map when carrying out the partial scan or the complete scan for bad blocks or when an erase, a read or a write operation performed on a block of the non-volatile semiconductor memory fails.

8. A method of controlling a storage device including a non-volatile semiconductor memory that has a raw physical capacity equal to a first size and is formatted to have a logical capacity equal to a second size, an over-provisioned amount, and a system area amount, the method comprising:
receiving a command from a host to reformat the non-volatile semiconductor memory;
determining a target logical capacity of the non-volatile semiconductor memory equal to a fifth size, the fifth size equal to the first size minus: (i) a third size corresponding to the predetermined amount of over-provisioning, (ii) a fourth size corresponding to the predetermined amount of the system area, and (iii) a total size of bad blocks of the non-volatile semiconductor memory; and
formatting the non-volatile semiconductor memory to have the target logical capacity.

9. The method of claim 8, wherein the third size is specified in the command from the host.

10. The method of claim 8, further comprising: responding to a query from the host for a value representing extra usable capacity with a value that is equal to the first size minus: (i) a size corresponding to a current logical capacity of the non-volatile semiconductor memory, (ii) the fourth size, and (iii) the total size of the bad blocks.

11. The method of claim 8, wherein the fifth size is less than the second size.

12. The method of claim 8, wherein the command from the host includes a parameter that can be set to one of multiple values, the value of the parameter determining whether or not the controller is to carry out a scan for bad blocks prior to said formatting.

13. The method of claim 12, further comprising: maintaining a map to track the bad blocks of the non-volatile semiconductor memory, wherein the target logical capacity of the non-volatile semiconductor memory is determined using the map without scanning if the parameter is set to a first value, with a partial scan for bad blocks if the parameter is set to a second value, and with a complete scan for bad blocks if the parameter is set to a third value.

14. The method of claim 13, further comprising: updating the map when carrying out the partial scan or the complete scan for bad blocks or when an erase, a read, or a write operation performed on a block of the non-volatile semiconductor memory fails.

* * * * *